United States Patent
Schiek et al.

(10) Patent No.: US 12,009,802 B2
(45) Date of Patent: Jun. 11, 2024

(54) BAW RESONATOR WITH IMPROVED TOP ELECTRODE CONNECTION

(71) Applicant: RF360 SINGAPORE PTE. LTD., Republic Plaza (SG)

(72) Inventors: Maximilian Schiek, Puchheim (DE); Willi Aigner, Moosinning (DE)

(73) Assignee: RF360 Singapore Pte. Ltd., Singapore (SG)

( * ) Notice: Subject to any disclaimer, the term of this patent is extended or adjusted under 35 U.S.C. 154(b) by 492 days.

(21) Appl. No.: 17/257,848

(22) PCT Filed: Jul. 1, 2019

(86) PCT No.: PCT/EP2019/067606
§ 371 (c)(1),
(2) Date: Jan. 4, 2021

(87) PCT Pub. No.: WO2020/025235
PCT Pub. Date: Feb. 6, 2020

(65) Prior Publication Data
US 2021/0297059 A1    Sep. 23, 2021

(30) Foreign Application Priority Data
Aug. 1, 2018 (DE) .......................... 102018118701.7

(51) Int. Cl.
*H03H 9/13* (2006.01)
*H03H 3/02* (2006.01)
(Continued)

(52) U.S. Cl.
CPC .............. *H03H 9/132* (2013.01); *H03H 3/02* (2013.01); *H03H 9/02118* (2013.01);
(Continued)

(58) Field of Classification Search
CPC .... H03H 9/132; H03H 9/02118; H03H 9/175; H03H 9/205
See application file for complete search history.

(56) References Cited

U.S. PATENT DOCUMENTS

| 2010/0091473 A1* | 4/2010 | Kiwitt | H03H 9/725 |
| | | | 361/782 |
| 2011/0084779 A1* | 4/2011 | Zhang | H03H 3/02 |
| | | | 333/187 |

(Continued)

FOREIGN PATENT DOCUMENTS

| EP | 0963000 A2 | 12/1999 |
| JP | 2005094728 A | 4/2005 |

(Continued)

OTHER PUBLICATIONS

International Search Report and Written Opinion—PCT/EP2019/067606—ISA/EPO—Oct. 9, 2019.

*Primary Examiner* — Bryan P Gordon
(74) *Attorney, Agent, or Firm* — Polsinelli

(57) ABSTRACT

A BAW resonator comprises a bottom electrode, a piezoelectric layer and a top electrode. A top electrode connection is arranged in a plane above the top electrode. For doing this a spacer is arranged on the top electrode. A capping layer is sitting on the spacer distant from the top electrode such that an air-filled gap to the top electrode is kept. The top electrode connection can now be arranged above the capping layer. An electrically conductive path connects the top electrode and the top electrode connection. Such a resonator needs only one lateral design and can provide a low-ohmic interconnection of resonators e.g. in a filter circuit.

11 Claims, 7 Drawing Sheets

(51) Int. Cl.
 *H03H 9/02* (2006.01)
 *H03H 9/17* (2006.01)
 *H03H 9/205* (2006.01)

(52) U.S. Cl.
 CPC ............ *H03H 9/175* (2013.01); *H03H 9/205* (2013.01); *H03H 2003/025* (2013.01)

(56) References Cited

U.S. PATENT DOCUMENTS

| | | | | |
|---|---|---|---|---|
| 2011/0148547 A1* | 6/2011 | Zhang | ................ | H03H 9/02118 333/187 |
| 2015/0381144 A1* | 12/2015 | Bradley | ............... | H03H 9/1014 333/132 |
| 2018/0254764 A1* | 9/2018 | Lee | ........................ | H03H 9/174 |

FOREIGN PATENT DOCUMENTS

| | | | |
|---|---|---|---|
| JP | 2007036829 | A | 2/2007 |
| JP | 2008098831 | A | 4/2008 |
| JP | 2009196078 | A | 9/2009 |
| JP | 2012244616 | A | 12/2012 |
| WO | 2009013938 | A1 | 1/2009 |

\* cited by examiner

BAW RESONATOR WITH IMPROVED TOP ELECTRODE CONNECTION

The present Application for Patent is a 371 of international Patent Application PCT/EP2019/067606, filed Jul. 1, 2019, which claims priority Germany Patent Application 10 2018 118 701.7, filed Aug. 1, 2018, which is hereby incorporated by referenced in its entirety and for all purposes.

In state of the art BAW resonators, different segments of the perimeter of the active region have different acoustic boundary conditions depending on whether there is applied a connection to the top electrode layer or to the bottom electrode layer or whether there is no electrode connection applied. Hence different lateral features are required for suppressing lateral acoustic energy leakage in the different regions.

Furthermore, there may be a tradeoff between optimized acoustic and electromagnetic behavior.

In a filter context, BAW resonators are connected to I/O pads, other resonators, or LC elements by applying electrode connections to their electrode layers. These connections require adapted lateral features for efficient lateral design means to suppress energy leakage that causes Q and filter performance degradation. Hence in a typical case, the lateral design needs to be optimized either for a non-connected region, a top electrode connected region or a bottom electrode connected region. Further, the filter in general needs to be optimized for low acoustic loss, low EM loss (i.e. ohmic loss), high power durability etc. which always requires compromises.

It is hence an object to provide an improved BAW resonator that requires less adaption to different lateral features.

This and other objects are met by a BAW resonator and a method of manufacture according to the independent claims.

Further features and advantageous embodiments are given by dependent claims.

A BAW resonator comprises a bottom electrode, a piezoelectric layer and a top electrode. Most general idea of the invention is to provide a top electrode connection for this BAW resonator that does not require adaption of the resonator to different lateral environments in the plane of the top electrode.

Hence, the top electrode connection is arranged in a plane above the top electrode. For doing this a spacer is arranged on the top electrode. A capping layer is sitting on the spacer distant from the top electrode such that an air-filled gap to the top electrode is kept. The top electrode connection can now be arranged above the capping layer. An electrically conductive path connects the top electrode and the top electrode connection.

The novel concept of this proposed solution reduces the number of lateral design optimization problems to only one and allows construing a BAW resonator with reduced chip size and ohmic losses.

The only one necessary lateral design is hence as symmetric as possible. The spacer is a closed frame and sits on a margin of an active resonator area to provide the electrically conductive path. Active resonator area means the lateral area where both electrodes and the piezoelectric layer are overlapping each other and where an acoustic bulk mode can be excited to propagate through the BAW resonator. The spacer is electrically conductive to provide electrical contact between top electrode connection and top electrode. A width of the spacer is minimized to have minimal influence on the acoustic main mode of the BAW resonator.

The capping layer is preferably formed from a dielectric layer and functions as a support layer for the top electrode connection. A sacrificial layer applied to the active area enclosed by the frame during manufacture and serving to support the applied capping layer needs to be removed later. Hence, release holes are formed in the capping layer.

After removing the sacrificial layer an organic sealing layer can be applied onto the capping layer sealing the release holes. Capping layer and sealing layer are structured to laterally terminate and flush with the outer edge of the frame.

A top metal layer is arranged on top of the sealing layer. According to a first embodiment the electrical contact between spacer and top metal layer is provided by an electrically conductive sealing layer. If no intrinsically conducting organic material is used a resin of the sealing layer can be filled with a conductive filler. Useful fillers are known from the art. Examples of useful fillers are graphite, graphene, carbon nanotubes, and metal nanoparticles/nanorods.

According to a second embodiment a conductive frame-like or frame-shaped through-contact through the organic sealing layer can be used. This frame can be manufactured on top of the capping layer before or more preferably after applying the sealing layer. In the latter case the sealing layer and the capping layer need to be structured for example by forming a trench exposing part of the spacer on the bottom of the trench. This trench can be filled with a metal in a suitable metal deposition process. The top of this frame-shaped through-contact contacts the top metal layer and the hence the top electrode connection.

According to an embodiment the top electrode and the piezoelectric layer are structured to flush with the frame-shaped spacer covering a first base area. During structuring the bottom electrode can be used as an etch stop. Hence, the bottom electrode has a second base area that is larger than the first base area and extends the spacer at all lateral directions.

The lateral design of the BAW resonator can be the same along the whole perimeter of the active area. It can be optimized be applying lateral structures on top of the top electrode inwardly adjacent to the conductive frame of the spacer. These lateral structures are designed to form and confine just the desired acoustic main mode and to avoid exciting of spurious modes. Such lateral structures may comprise annular structures the height of which being enhanced or reduced in view of the center of the active area. As far as possible these lateral structures have a constant cross section. Further, they may be formed as a wing-like structure and can extend distant from the surface of the resonator inwardly to the center of the active resonator region, upwardly or outwardly towards the edge of the resonator. The lateral structures are preferably of the same cross-section along the perimeter.

In the following the invention will be explained in more detail with reference to preferred embodiments and the accompanied figures. The figures are drawn schematically only and not to scale. Hence, neither relative nor absolute dimensions can be gathered from the drawings.

FIG. 1 shows a Bragg mirror deposited on a substrate in a schematic cross-section FIG. 2 shows the arrangement of FIG. 1 after applying and structuring a bottom electrode FIG. 3 shows the arrangement of FIG. 2 after applying a piezoelectric layer FIG. 4 shows the arrangement of FIG. 3 after applying and structuring a top electrode layer FIG. 5 shows the arrangement of FIG. 4 after applying and structuring lateral structures on the top electrode layer FIG. 6 shows the arrangement of FIG. 5 after applying a conductive spacer FIG. 7 shows the arrangement after applying and structuring a sacrificial layer FIG. 8 shows the arrangement after applying and structuring a capping layer FIG. 9 shows the arrangement after removing the sacrificial layer FIG. 10 shows the arrangement after applying and structuring an electrically conductive sealing layer FIG. 11A shows the arrangement of FIG. 10 after applying and structuring a top metal layer on an electrically conductive sealing layer FIG. 11B shows the arrangement of FIG. 11A where additionally the piezoelectric layer is structured to flush with an outer edge of the spacer FIG. 12 shows the arrangement of FIG. 9 after applying and structuring an electrically isolating sealing layer FIG. 13 shows the arrangement of FIG. 12 after producing a frame-like through-contact FIG. 14A shows the arrangement of FIG. 13 after applying and structuring a top metal layer FIG. 14B shows a similar arrangement like FIG. 14A with a piezoelectric layer structured to flush with an outer edge of the spacer FIG. 15 shows an arrangement of at least two adjacently arranged BAW resonators according to FIG. 11B after filling the space between the BAW resonators with a filler dielectric FIG. 16 shows an arrangement of at least two adjacently arranged BAW resonators according to FIG. 14B after filling the space between the BAW resonators with a filler dielectric FIG. 17 shows a schematic block diagram of a filter circuit using the proposed BAW resonator.

On a suitable substrate SU like silicon for example an acoustic Bragg mirror BM is formed and structured. The Bragg mirror BM comprises two mirrors M1, M2 respectively formed of a pairs of mirror layers. In the Bragg mirror BM, high impedance layer HI (e.g., HI layers H1 and H2 of FIG. 1) and low impedance layers LI (e.g., LI1, LI2, and LI3 layers of FIGS. 1-3) are alternating. The mirror layers may slightly vary in thickness to set a desired reflection band. High impedance layer HI may comprise W and low impedance layers LI comprise $SiO_2$. Additional thin adhesion or orientation-promoting layers may be deposited below a mirror pair, e.g. Ti or AlN. Each conductive high impedance mirror layer HI is structured to be restricted to the area of the later resonator. Low impedance layers LI need not be structured.

Optionally CMP planarization of the topmost mirror layer of $SiO_2$ can be employed for the mirror layers and or the later bottom electrode layers.

FIG. 1 shows the completed Bragg mirror BM in a schematic cross-section.

FIG. 2 shows the arrangement of FIG. 1 after applying a bottom electrode layer BE and structuring to the desired active area of the later resonator. The bottom electrode BE is formed using a highly conductive AlCu layer and a high impedance layer e.g. a W layer or a Mo layer. Again a thin adhesion or orientation-promoting layer may be employed between the bottom electrode and uppermost mirror, e.g. Ti or AlN. Also a capping and/or etch-stop layer such as TiN may be applied to the top of the AlCu layer to allow patterning of additional resonator detuning material located between the Tungsten and AlCu layer of the bottom electrode BE.

Atop the bottom electrode BE a piezoelectric layer PL of e.g. AlN or AlScN is formed. The thickness thereof is set to lower than half the wavelength of the desired resonance frequency due the additional mass loading effect from being attached to the top/bottom electrodes BE and mirror M. FIG. 3 shows the arrangement after applying a piezoelectric layer.

A top electrode TE may be formed from a stack of layers. The conductive metal may selected from the same group of metals like the bottom electrode. The stack may e.g. comprise when starting from the top surface of the piezoelectric layer PL a thin adhesive layer like a Ti layer for example, a conductive layer e.g. a tungsten layer and an AlCu layer, a thin TiN layer and optionally a dielectric layer of e.g. SiN are deposited. The SiN layer provides device passivation and can serve as frequency fine-tuning trimming layer.

FIG. 4 shows the arrangement after applying and structuring the top electrode layer TE.

On the top electrode layer TE near the outer edge thereof a lateral structure LS is formed that is suitable to support the acoustic main mode and to suppress undesired spurious lateral modes by reflection thereof if optimally designed. Further, by these lateral structures a lateral velocity profile is formed. These lateral structures are known from the art and may be formed from a metal and/or a dielectric. FIG. 5 shows the arrangement at this stage.

In the next step a conductive spacer CS is deposited and structured. The spacer may comprise the same metal like the top electrode, e.g. Tungsten, Mo or AlCu. However, any other conductive material is also possible. The spacer is arranged directly adjacent to the outer edge of the top electrode TE. Hence, the edges of both structures are flushing. FIG. 6 shows the arrangement with the conductive spacer CS. Due to the reflective effect of the lateral structures LS there is very low acoustic energy that can extend outwardly from the center of the resonator to extend over the lateral structures. Hence, there is no mechanical effect of the conductive spacer that may interact with the acoustic wave. The acoustic is not disturbed by the conductive spacers.

In the next step a sacrificial layer OS is deposited. Preferably a photoresist is used for this purpose to allow direct structuring thereof. The sacrificial layer OS is restricted to the surface of the top electrode that is enclosed by the conductive spacer CS. FIG. 7 shows the arrangement after applying and structuring a sacrificial layer OS.

On the plane surface of the OS layer a capping layer CL is applied and structured. Release holes RH are provided in the capping layer CL. Further, in an annular margin area of the capping layer CL the outer edge of the conductive spacer CS is exposed. FIG. 8 shows the arrangement after applying and structuring the capping layer CL. $SiO_2$ or any other suitable dielectric can be used as a preferred material for the capping layer.

Now the material of the sacrificial layer OS can be removed through the release holes RH preferably by a wet chemical treatment with a solvent for example. Dry etching is also possible and avoids removal of residual wet chemicals.

FIG. 9 shows the arrangement after that release. Between capping layer CL and top electrode TE an air-filled gap GP has formed.

In the next step the release holes are closed/sealed with a sealing layer SL. According to a variant a conductive high-viscosity polymer like BCB (Benzocyclobutene) can be used for this purpose. For achieving suitable electrical conductivity, the polymer is filled with a conductive filler. Suitable conductive fillers are chosen from Graphite, Graphene, BCB, carbon nano-tubes, metal nano-particles and metal nano-rods. A structuring step restricts the area of the sealing layer SL to the area of the capping layer CL. FIG. 10 shows the arrangement after applying and structuring a sealing layer.

An enforcement of the sealing layer SL and a solderable contact pad or a highly conductive conductor line is achieved by a thick top metal layer TM applied by deposition onto the sealing layer SL. A base metallization can be sputtered and structured before enforcing it by plating in a galvanic or current-less step. FIG. 11A shows the arrangement after applying and structuring a top metal layer.

According to a further variant the piezoelectric layer PL is etched away in those areas where it is exposed and not covered by the top electrode TE. FIG. 11B shows the arrangement which differs from the arrangement of FIG. 11A in that exposed areas of the piezoelectric layer PL have been removed . . . .

FIG. 11B shows a similar arrangement which starts from the arrangement of FIG. 11 after applying and structuring a top metal layer on an electrically conductive sealing layer. In this example, the sealing layer SL is electrically conductive and exposed areas of the piezoelectric layer PL have been removed.

In FIG. 12 a variant is shown, wherein contrary to the arrangement of FIG. 10 a non-conducting sealing layer SL is used.

As the sealing layer SL is non-conductive a through-contact to the conductive spacer CS is necessary. Hence, a frame-like through-contact TC consisting of a metal bump frame can be produced and deposited. This through-contact TC electrically couples to the spacer CS. FIG. 13 shows the so produced arrangement.

However, depending on the used etching system any other layer like bottom electrode or a layer applied above the bottom electrode may serve as an etching mask. Of course, additionally applied masks can also be used. Etching of the piezoelectric layer PL may be done at any former stage shown in any of FIGS. 4 to 9.

Figure 12:
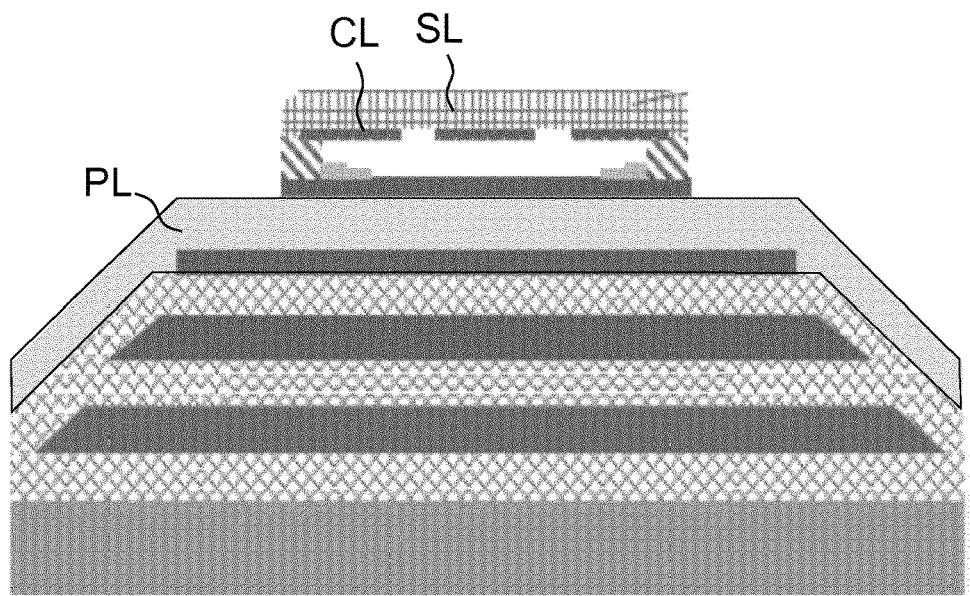
Figure 13:
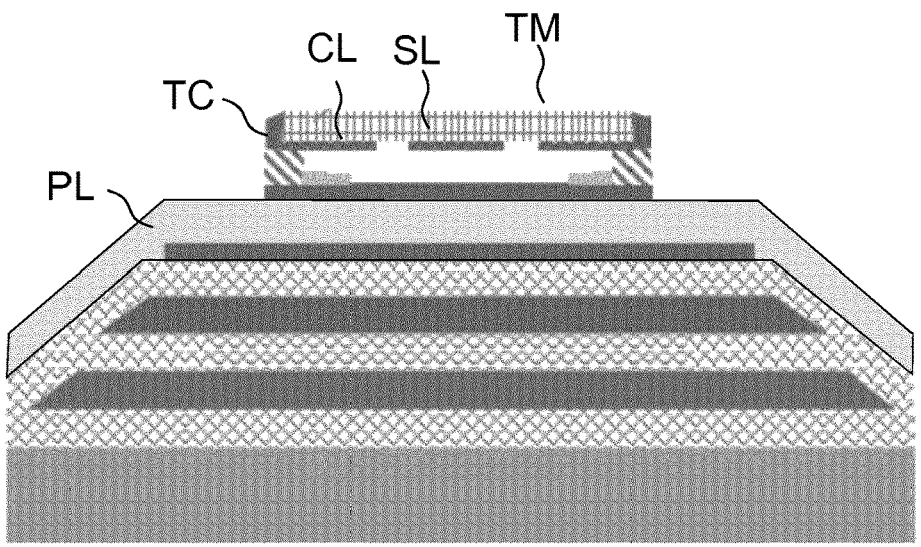
Figure 14A:
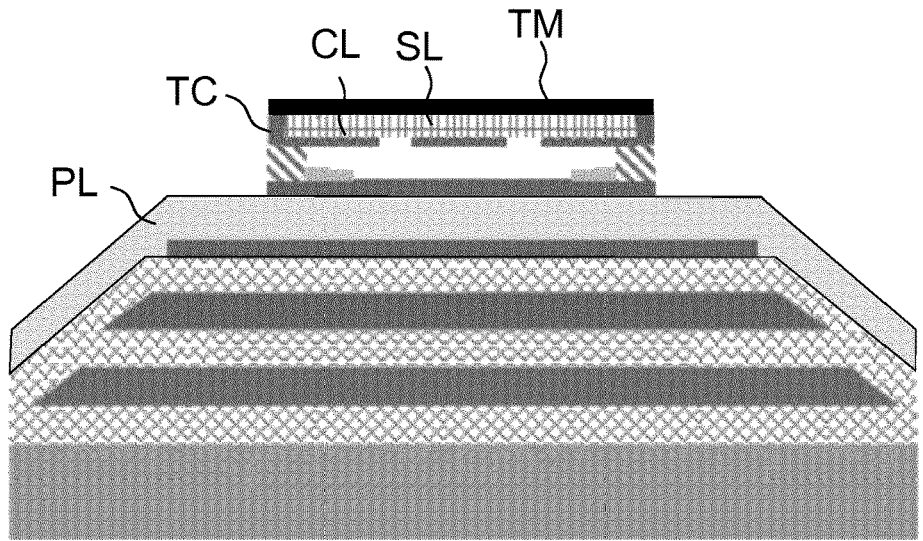
FIG. 14A shows the arrangement after applying and structuring a top metal layer TM onto the sealing layer SL thereby electrically conducting the through-contact TC.
Figure 14B:
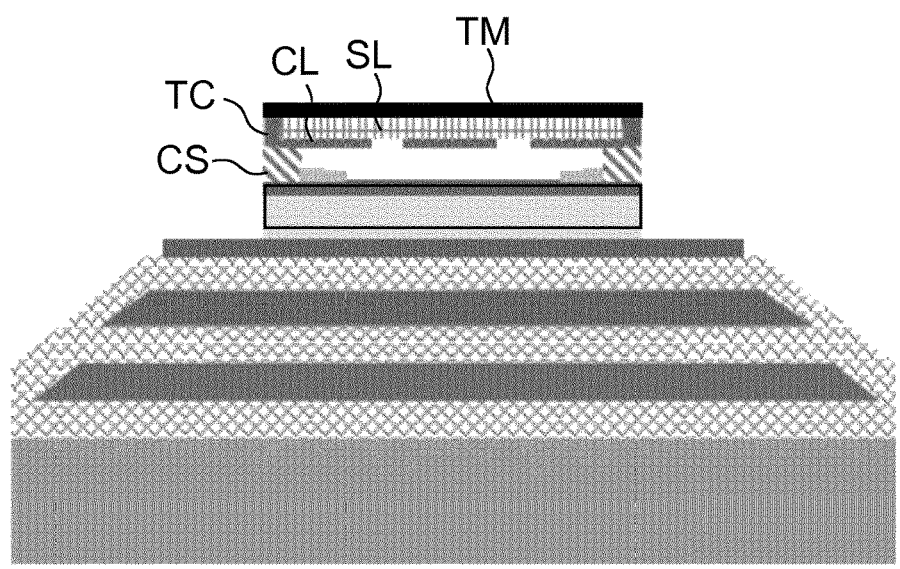
FIG. 14B shows a similar arrangement like FIG. 14A except to the fact that the piezoelectric layer PL has been structured to flush with an outer edge of the spacer CS. Etching can be done before after applying top metal TM that may serve as an etching mask.

This means that the arrangements shown in FIGS. 12 and 14B can be produced another way without using the stage shown in FIG. 14A.

In FIGS. 1 to 14 single BAW resonators have been shown. However, most applications of BAW resonators use a circuit comprising a multitude of BAW resonators interconnected to each other according to a filter circuit for example. For doing this the top metal layer provides an ideal pad structure for electrically connecting the BAW resonator via its top electrode TE.

Figure 1:
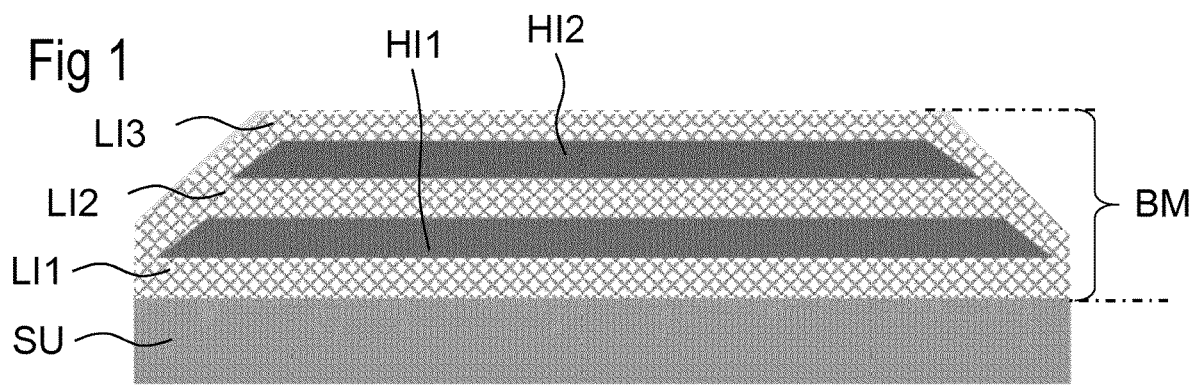
Figure 2:
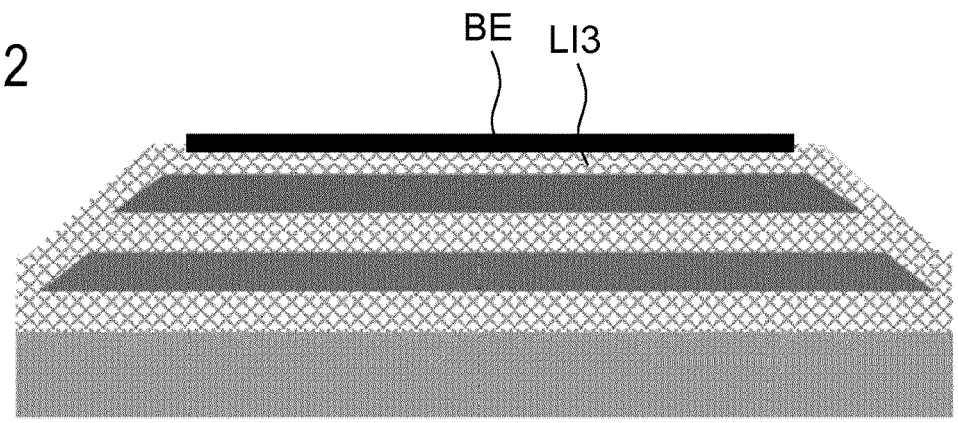
Figure 3:
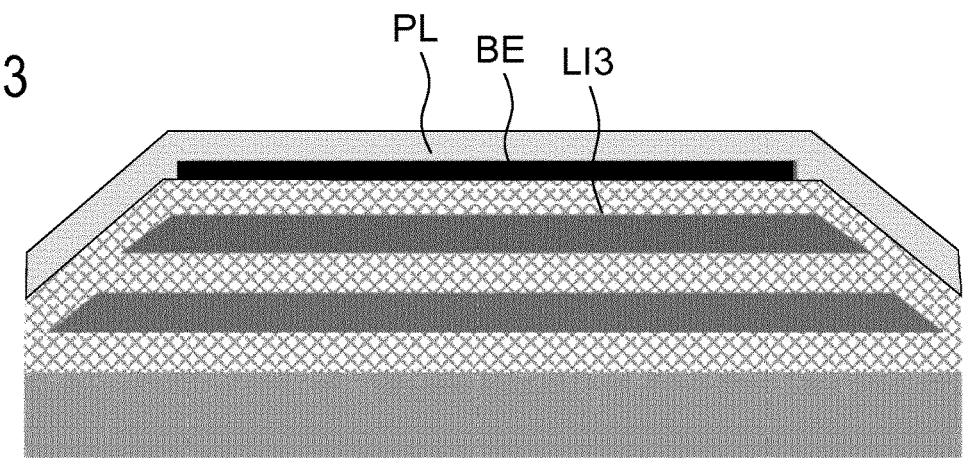
Figure 4:
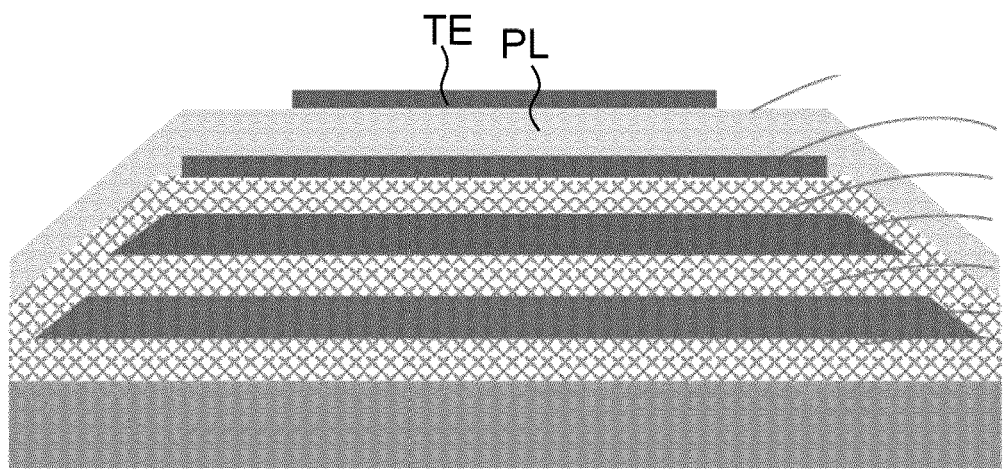
Figure 5:
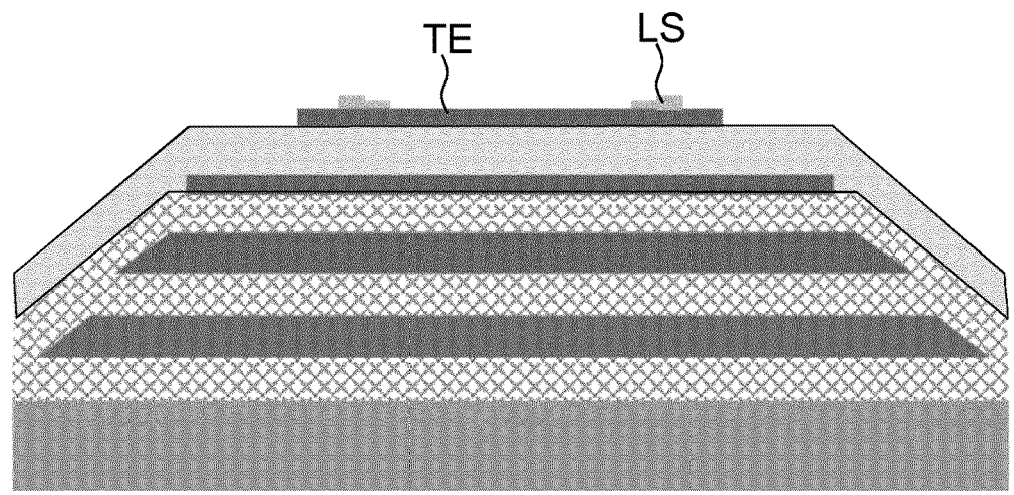
Figure 6:
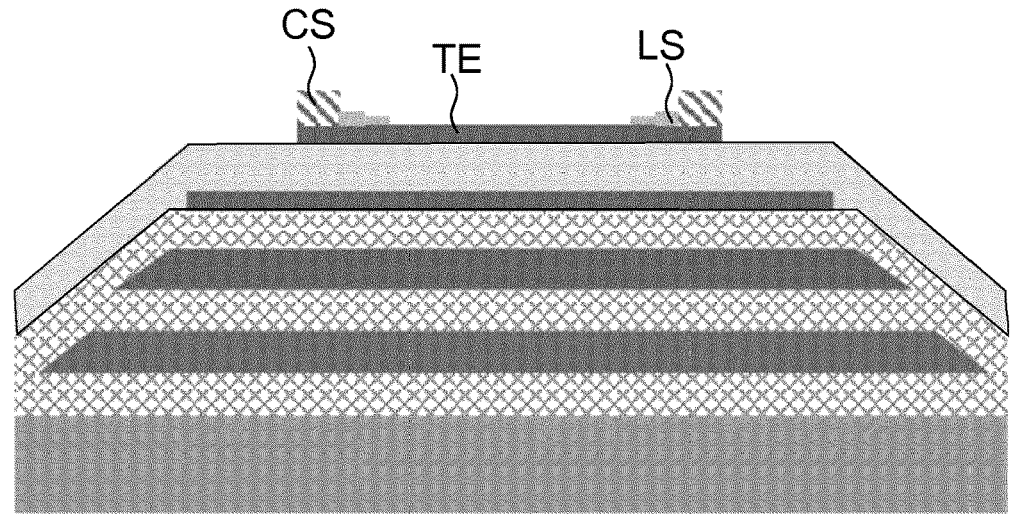
Figure 7:
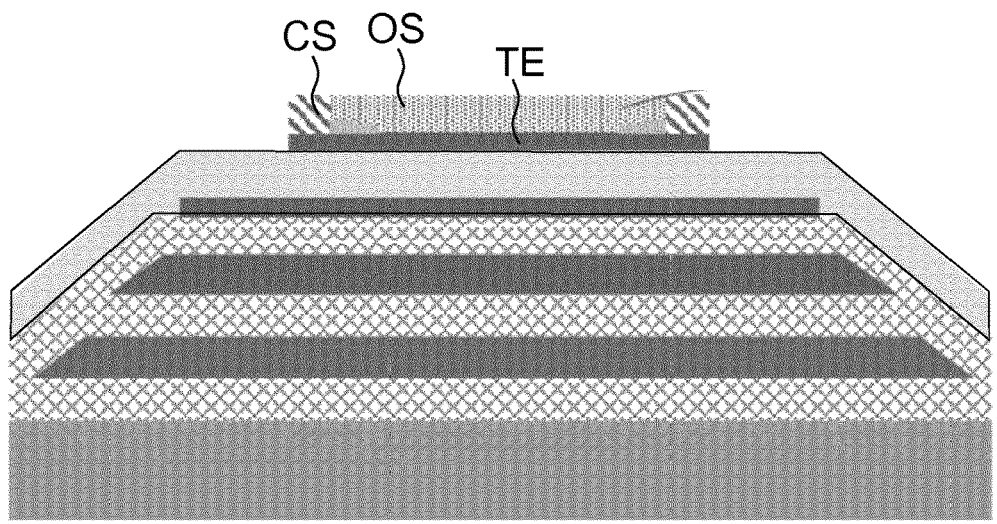
Figure 8:
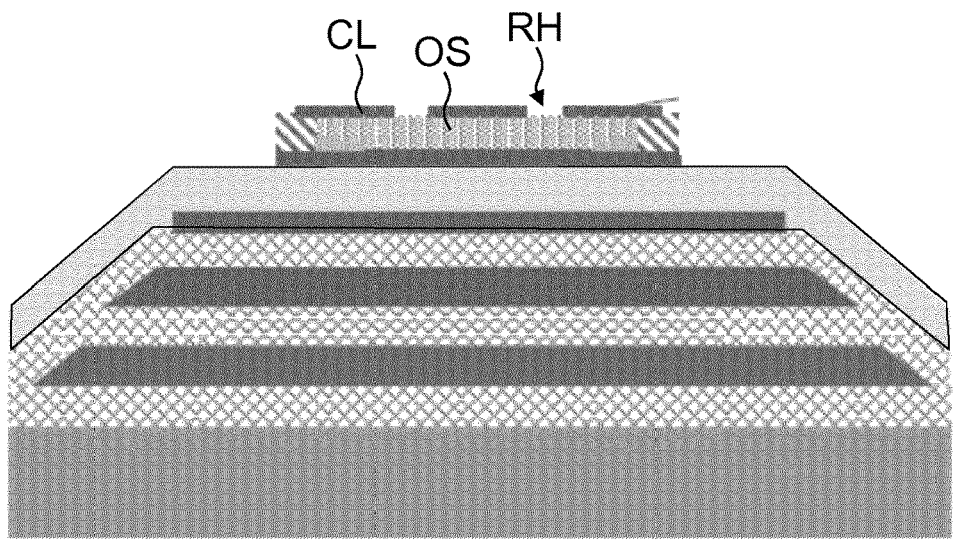
Figure 9:
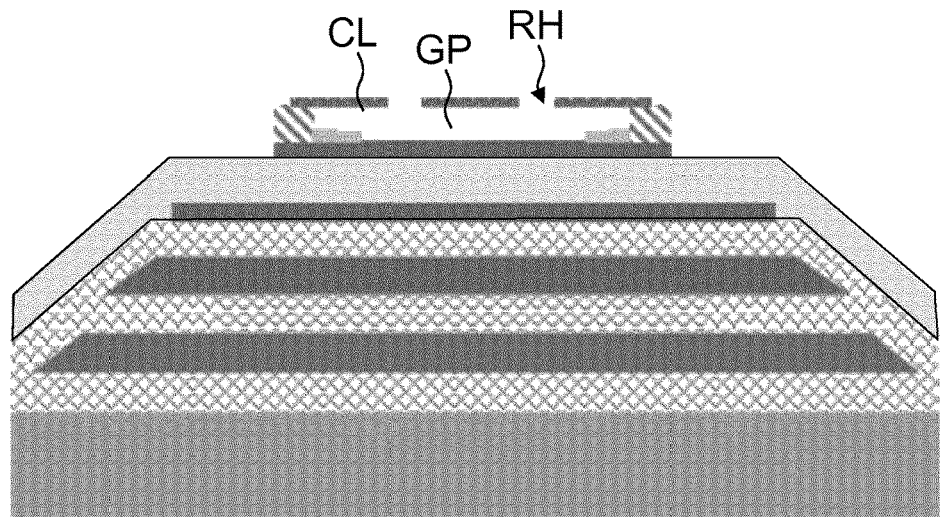
Figure 10:
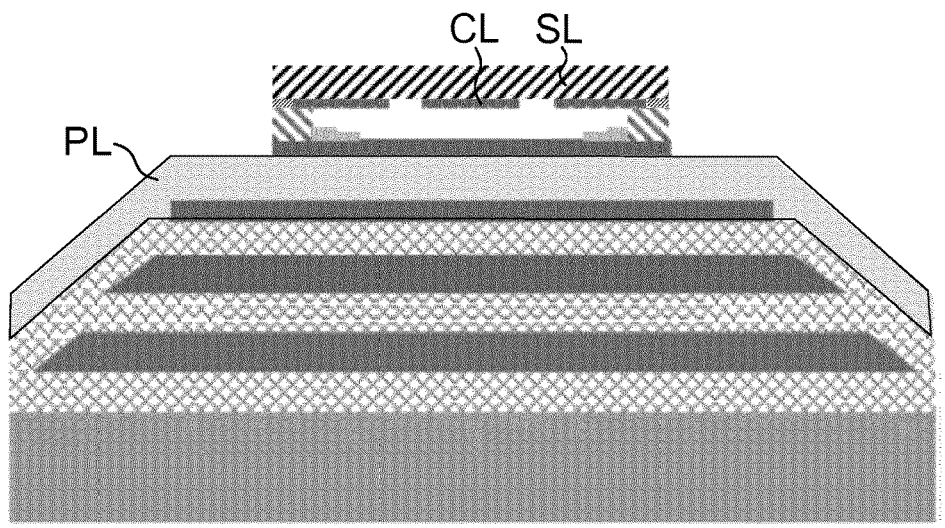
Figure 11A:
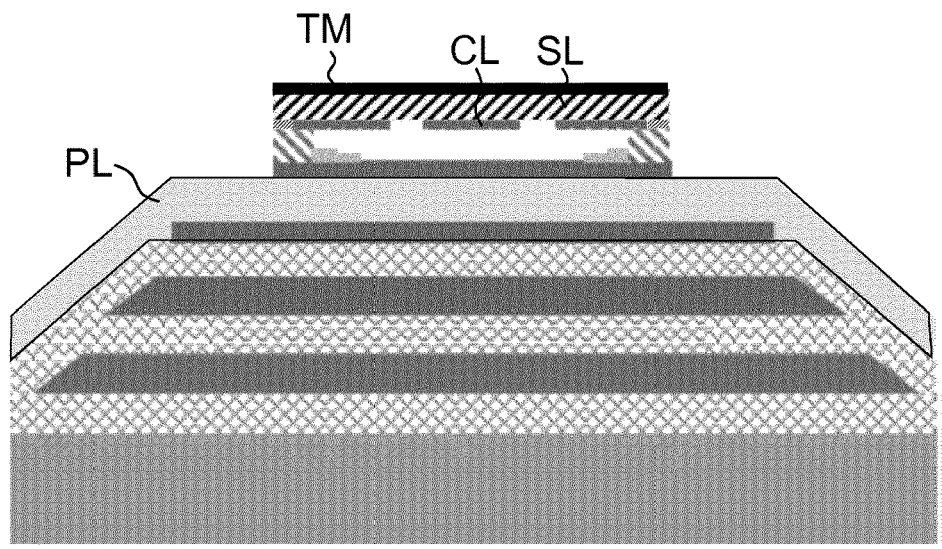
Figure 11B:
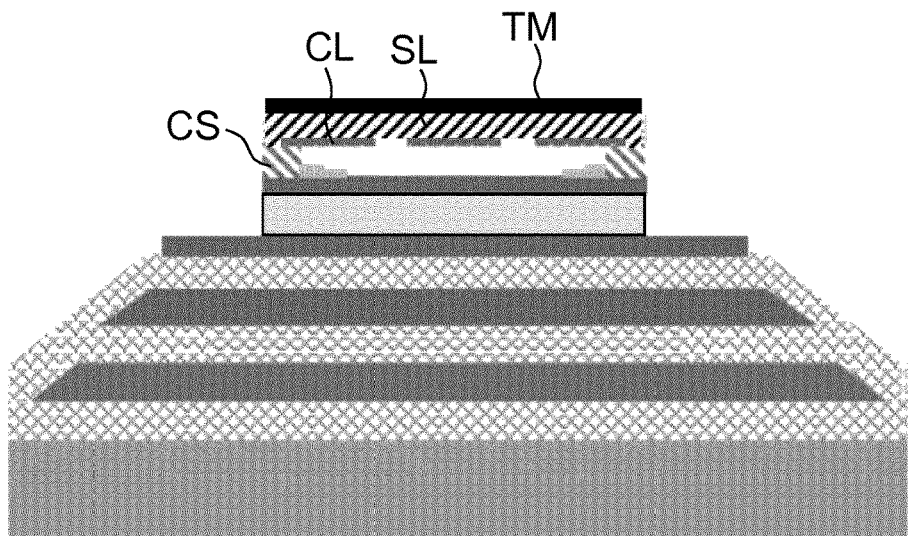
Figure 15:
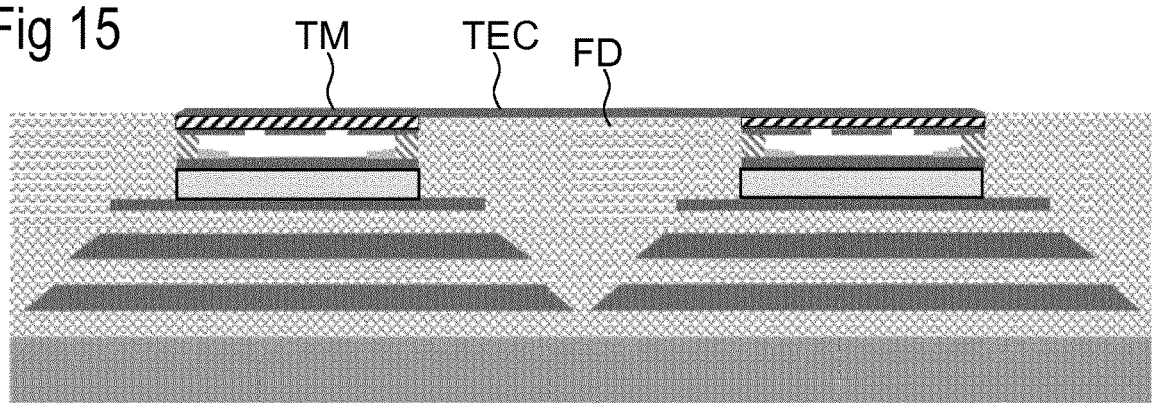
Figure 16:
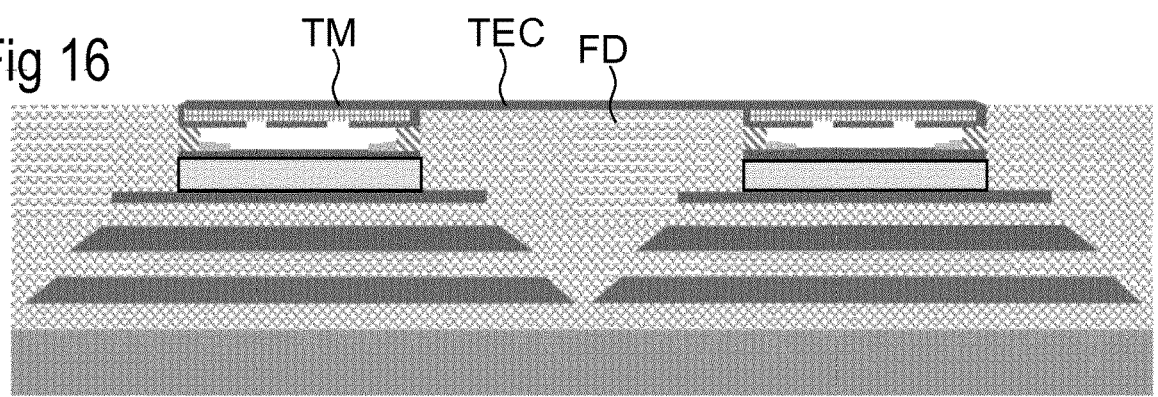

FIGS. 15 and 16 show arrangements of at least two adjacently arranged BAW resonators according to FIGS. 11B and 14B after filling the space between the two shown BAW resonators with a filler dielectric FD. A CVD process using TEOS as a precursor can be used for depositing filler dielectric.

The top metal TM of the two BAW resonators is connected via a top electrode connection TEC formed by a respective metallic structure applied onto the filler dielectric FD. Similarly the top electrode connection TEC may be guided to other devices (not shown in the figure), to an external terminal or to integrated passive LC elements.

FIG. 15 complies with the arrangement of FIG. 11B with a conductive sealing layer. FIG. 16 complies with an arrangement according to FIG. 14B with a frame-shaped through-contact through a con-conductive sealing layer SL.

In a circuit comprising a multitude of BAW resonators interconnected to each other according to FIGS. 15 and 16 electrical contact to the bottom electrode BE is also necessary. Contact can be provided by vias that are etched through the filler dielectric for example. The larger area of the bottom electrode BE extending over the active resonator area can be used as an etch stop when producing respective vias.

Figure 17:
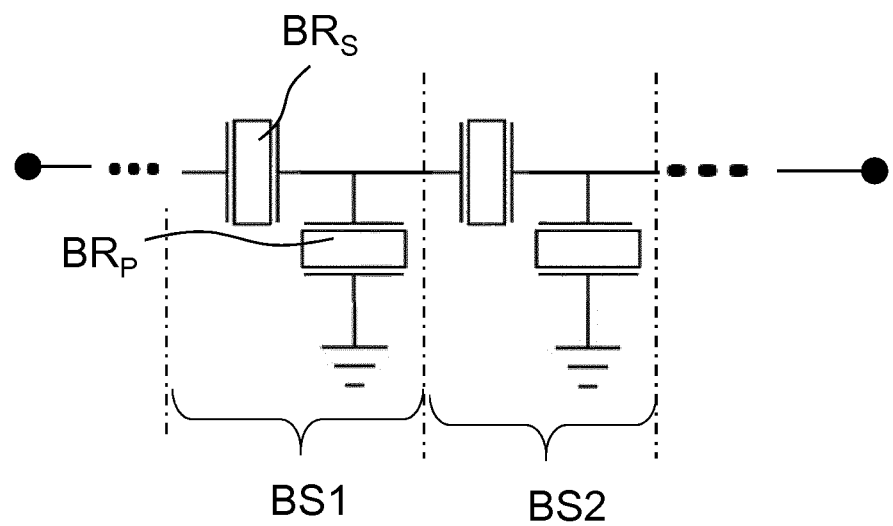

FIG. 17 shows a schematic block diagram of a filter circuit using the proposed BAW resonator in a ladder-type arrangement. The filter circuit comprises series BAW resonators $BR_S$ and parallel BAW resonators $BR_P$ that may be formed according to the invention. In this filter circuit a respective series BAW resonator $BR_S$ and an according parallel BAW resonator $BR_P$ form a basic section $BS_{LT}$ of the ladder-type arrangement (e.g., BS1, BS2). The total circuit comprises an arbitrary number of basic sections $BS_{LT}$ that can be circuited in series to achieve a desired filter function.

The proposed invention provides the following advantages:
- No CMP is needed when the piezo layer is removed completely in outer regions because structure inhomogeneities that can arise when the piezoelectric layer is applied over the edges of structured mirror layers are removed and hence do not disturb any more.
- only one lateral edge design needs to be optimized
- by the new design a size reduction is achieved as resonators can be arranged as close to one another as possible and interconnection routing can be done above (via top electrode connection TEC) and below the piezoelectric instead of in between resonators.
- the top surface of each resonator is robust and suitable for a multitude of contacting techniques
- the robust top surface of each resonator may allow to omit further packaging
- a BAW resonator with lower ohmic losses is achievable when using thick interconnections (top metal TM and top electrode connection TEC)
- the BAW resonator has high power durability as the interconnections fulfil an additional function as heat spreaders.

The invention is not limited by the shown figures and described concrete embodiments and can thus be varied without departing from the scope given by the claims.

LIST OF USED REFERENCE SYMBOLS

AR active resonator region
BE bottom electrode
BM Bragg mirror
BRP parallel BAW resonator
BRS series BAW resonator
BS basic section of a filter circuit
CL capping layer, e.g.
CP cap
CS conductive spacer, e.g.
FD filler dielectric
GP air-filled gap
HI high impedance mirror layer
LI low impedance mirror layer M1, M2 mirror (pair of mirror layers)
OS sacrificial layer
PL piezoelectric layer
RH release hole
SL organic sealing layer
SU substrate
TC frame-like through-contact
TE top electrode
TEC top electrode connection
TM top metal layer

The invention claimed is:

1. A BAW resonator, comprising:
a bottom electrode;
a piezoelectric layer;
a top electrode;
a spacer arranged above the piezoelectric layer and disposed on the top electrode;
a capping layer sitting on the spacer and keeping an air-filled gap to the top electrode
a top electrode connection arranged above the capping layer; and
an electrically conductive path connecting the top electrode and the top electrode connection.

2. The BAW resonator of claim 1, wherein the spacer is a conductive frame sitting on a margin of an active resonator area to provide the electrically conductive path.

3. The BAW resonator of claim 1, wherein:
the capping layer is a dielectric layer with release holes; and
an organic sealing layer covers the capping layer.

4. The BAW resonator of claim 1, wherein:
the spacer is a conductive frame sitting on a margin of an active resonator area;
an organic sealing layer covers the capping layer;
a top metal layer is arranged on top of the organic sealing layer; and
an electrical contact between the spacer and the top metal layer is made by the organic sealing layer being filled with a conductive filler, or by an electrically isolating frame-like or frame-shaped through-contact through the organic sealing layer.

5. The BAW resonator of claim 4, wherein:
the piezoelectric layer, the top electrode, the spacer and the organic sealing layer are structured to have a first base area; and
the bottom electrode has second base area larger than the first base area to enable use of the bottom electrode as an etch-stop layer.

6. The BAW resonator of claim 1, wherein:
a plurality of BAW resonators are arranged one besides another on a substrate;
a Bragg mirror is arranged between each of the plurality of BAW resonators and the substrate;
the bottom electrode and each Bragg mirror under each of the plurality of BAW resonators are structured and electrically isolated against each other;
a space between adjacent BAW resonators of the plurality of BAW resonators on the substrate is filled with a filler dielectric;
the filler dielectric has a planarized surface; and
the top electrode connection is arranged on top of the planarized surface of the filler dielectric.

7. The BAW resonator of claim 1, further comprising lateral structures on top of the top electrode inwardly adjacent to a conductive frame, the lateral structures having mainly a constant cross section and adapted to confine and form a main mode.

8. The BAW resonator of claim 1, wherein the electrically conductive path comprises the spacer; and
wherein the spacer is a conductive frame sitting on a margin of an active resonator area to provide the electrically conductive path connecting the top electrode and the top electrode connection via the spacer.

9. The BAW resonator of claim 1, wherein the electrically conductive path comprises at least a portion of the spacer.

10. A BAW resonator, comprising:
a bottom electrode;
a piezoelectric layer;
a top electrode;
a spacer arranged above the piezoelectric layer on the top electrode on a margin of an active resonator area;
a capping layer sitting on the spacer and keeping an air-filled gap to the top electrode
a top electrode connection arranged above the capping layer; and
an electrically conductive path connecting the top electrode and the top electrode connection.

11. The BAW resonator of claim 10, wherein the spacer comprises a conductive spacer; and
wherein the an electrically conductive path connects the top electrode and the top electrode connection via the conductive spacer.

* * * * *